(12) United States Patent
Yang et al.

(10) Patent No.: US 10,680,447 B2
(45) Date of Patent: Jun. 9, 2020

(54) CHARGE EQUALIZATION APPARATUS FOR A BATTERY STRING

(71) Applicant: SK INNOVATION CO., LTD., Seoul (KR)

(72) Inventors: Jeong Hwan Yang, Busan (KR); Gun-Woo Moon, Daejeon (KR); Chol-Ho Kim, Daejeon (KR); Moon-Young Kim, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 0 days.

(21) Appl. No.: 15/495,592

(22) Filed: Apr. 24, 2017

(65) Prior Publication Data

US 2017/0288422 A1     Oct. 5, 2017

Related U.S. Application Data

(62) Division of application No. 14/113,257, filed as application No. PCT/KR2011/002926 on Apr. 22, 2011, now abandoned.

(51) Int. Cl.
*H02J 7/00* (2006.01)
*H01M 10/44* (2006.01)
(Continued)

(52) U.S. Cl.
CPC ......... *H02J 7/0014* (2013.01); *H01M 10/441* (2013.01); *H01M 10/482* (2013.01);
(Continued)

(58) Field of Classification Search
CPC ... H02J 7/0014; H01M 10/441; H01M 10/482
(Continued)

(56) References Cited

U.S. PATENT DOCUMENTS 4,616,170 A * 10/1986 Urstoger ............... H01M 10/44
320/119
5,148,042 A * 9/1992 Nakazoe ............... G06F 1/1616
307/60
(Continued)

FOREIGN PATENT DOCUMENTS

DE     4132229 A1 *  4/1993  ......... G01R 31/3648
DE     4132229 C2 *  2/1994  ......... G01R 31/3648
(Continued)

OTHER PUBLICATIONS

("What are the advantages and disadvantages of integrated circuits," Bullet, Yahoo Answers, Published 2009, Accessed Aug. 27, 2015, https://in.answers.yahoo.com/question/index?qid=20090820000531AA5XIAA.*

*Primary Examiner* — Robert Grant
*Assistant Examiner* — John T Trischler
(74) *Attorney, Agent, or Firm* — IP & T Group LLP (57) ABSTRACT

Provided are a charge equalization apparatus for a battery string. According to the exemplary embodiments of the present invention, the charge equalization apparatus are modularized by being divided into the master unit and the slave unit, such that the charge equalization apparatus may be expanded and contracted independent of the number of batteries, the circuits are separated for each module, such that the circuits may be easily implemented, and when the circuits are damaged, only the damaged module is replaced, such that the effective countermeasure may be performed.

5 Claims, 6 Drawing Sheets

(51) Int. Cl.
*H01M 10/48* (2006.01)
*G01R 31/396* (2019.01)
*G01R 31/3835* (2019.01)
*G01R 19/165* (2006.01)

(52) U.S. Cl.
CPC ...... *H02J 7/0018* (2013.01); *G01R 19/16542* (2013.01); *G01R 31/3835* (2019.01); *G01R 31/396* (2019.01); *H02J 7/0048* (2020.01)

(58) Field of Classification Search
USPC .......................................................... 320/119
See application file for complete search history.

(56) References Cited

U.S. PATENT DOCUMENTS

| | | | | |
|---|---|---|---|---|
| 5,153,496 A * | 10/1992 | LaForge | ............... | H02J 7/0013 320/119 |
| 5,438,250 A * | 8/1995 | Retzlaff | ............... | H02J 7/0019 320/128 |
| 5,498,950 A * | 3/1996 | Ouwerkerk | ......... | B60L 11/1861 320/119 |
| 5,578,914 A * | 11/1996 | Morita | .................. | H01M 10/44 320/122 |
| 5,710,504 A * | 1/1998 | Pascual | ................ | H02J 7/0018 180/65.8 |
| 5,818,201 A * | 10/1998 | Stockstad | ............. | H02J 7/0016 320/116 |
| 5,821,734 A * | 10/1998 | Faulk | .................... | H01M 10/46 320/124 |
| 5,914,606 A * | 6/1999 | Becker-Irvin | ......... | G01R 15/04 320/116 |
| 5,920,179 A * | 7/1999 | Pedicini | ............... | H02J 7/0016 320/122 |
| 5,998,969 A * | 12/1999 | Tsuji | .................... | H02J 7/0016 320/130 |
| 6,157,165 A * | 12/2000 | Kinoshita | ............. | H02J 7/0019 320/116 |
| 6,262,561 B1 * | 7/2001 | Takahashi | ........... | B60L 11/1851 320/104 |
| 6,291,972 B1 * | 9/2001 | Zhang | ................... | H02J 7/0018 320/116 |
| 6,511,764 B1 * | 1/2003 | Marten | ............... | H01M 10/441 320/119 |
| 6,538,414 B1 * | 3/2003 | Tsuruga | ............... | H02J 7/0016 320/119 |
| 6,583,602 B2 * | 6/2003 | Imai | ...................... | H02J 7/0018 320/118 |
| 7,002,265 B2 * | 2/2006 | Potega | .............. | B60L 11/185 307/149 |
| 7,135,836 B2 * | 11/2006 | Kutkut | ................... | H02J 7/022 320/116 |
| 7,193,392 B2 * | 3/2007 | King | ....................... | B60L 58/22 320/118 |
| 7,245,108 B2 * | 7/2007 | Chertok | ................. | B60L 58/22 320/132 |
| 7,378,818 B2 * | 5/2008 | Fowler | ................. | B60L 11/185 320/108 |
| 7,516,726 B2 * | 4/2009 | Esaka | .................. | H02J 7/0019 123/179.3 |
| 7,554,291 B2 * | 6/2009 | Yoshida | ................ | H02J 7/0016 320/116 |
| 7,564,217 B2 * | 7/2009 | Tanigawa | ............. | H02J 7/0016 320/118 |
| 7,564,218 B2 * | 7/2009 | Ooishi | ............. | B60L 11/1851 320/118 |
| 7,598,706 B2 * | 10/2009 | Koski | ................ | H01M 10/441 307/48 |
| 7,615,966 B2 * | 11/2009 | Houldsworth | ........ | H02J 7/0016 320/118 |
| 7,638,973 B2 * | 12/2009 | Lee | ....................... | H02J 7/0029 320/118 |
| 7,663,341 B2 * | 2/2010 | Lee | ..................... | H01M 10/441 320/118 |
| 7,786,699 B2 * | 8/2010 | Demers | ................ | H02J 7/0014 320/116 |
| 7,825,629 B2 * | 11/2010 | Studyvin | ............... | H02J 7/0016 320/116 |
| 7,880,434 B2 * | 2/2011 | White | ................... | H02J 7/0016 320/116 |
| 7,911,178 B2 * | 3/2011 | Kawata | ............... | B60L 11/1868 320/116 |
| 7,928,691 B2 * | 4/2011 | Studyvin | ............... | H02J 7/0018 307/43 |
| 7,933,694 B2 * | 4/2011 | Kato | ..................... | B60W 20/13 180/65.22 |
| 8,103,401 B2 * | 1/2012 | Kubo | ................. | B60L 11/1855 320/116 |
| 8,115,453 B2 * | 2/2012 | Houldsworth | ........ | H02J 7/0016 320/118 |
| 8,143,849 B2 * | 3/2012 | Miglioranza | ......... | H02J 7/1407 320/107 |
| 8,143,851 B2 * | 3/2012 | Greening | ................ | G06F 1/189 320/116 |
| 8,159,184 B2 * | 4/2012 | Emori | ................... | B60L 3/0046 307/10.1 |
| 8,174,237 B2 * | 5/2012 | Kosugi | ................. | B60L 3/0046 320/116 |
| 8,253,378 B2 * | 8/2012 | Lee | ........................ | H02J 7/0016 320/116 |
| 8,294,421 B2 * | 10/2012 | Bucur | ................... | H02J 7/0019 320/116 |
| 8,307,223 B2 * | 11/2012 | Tae | ..................... | G01R 31/3658 713/300 |
| 8,339,099 B2 * | 12/2012 | Emori | ................... | B60L 3/0046 320/116 |
| 8,354,825 B2 * | 1/2013 | Lee | ....................... | H02J 7/0018 320/116 |
| 8,401,728 B2 * | 3/2013 | Kubo | ................. | B60L 11/1855 324/522 |
| 8,410,756 B2 * | 4/2013 | Sakakibara | ......... | H01M 2/1022 320/107 |
| 8,432,132 B2 * | 4/2013 | Nakanishi | ............. | H02J 7/0016 320/116 |
| 8,547,065 B2 * | 10/2013 | Trigiani | ................ | H02J 7/0018 320/119 |
| 8,569,995 B2 * | 10/2013 | Eberhard | .......... | H01M 10/4207 320/106 |
| 8,593,015 B2 * | 11/2013 | Gottlieb | .................... | H02J 1/10 307/87 |
| 8,649,935 B2 * | 2/2014 | Kubo | ................. | B60L 11/1855 324/522 |
| 8,653,792 B2 * | 2/2014 | Nishida | ................ | H01M 10/44 320/116 |
| 8,710,801 B2 * | 4/2014 | Schwartz | ............... | H02J 7/0016 320/119 |
| 8,723,483 B2 * | 5/2014 | Shimizu | ................ | H02J 7/0016 320/116 |
| 8,766,598 B2 * | 7/2014 | Oh | ........................ | H02J 7/0019 320/119 |
| 8,779,722 B2 * | 7/2014 | Lee | ...................... | H02J 7/0016 320/116 |
| 8,786,256 B2 * | 7/2014 | Emori | ................... | B60L 3/0046 320/116 |
| 8,791,668 B2 * | 7/2014 | Emori | ................... | B60L 3/0046 320/118 |
| 8,823,323 B2 * | 9/2014 | Troxel | ............... | H01M 10/4207 320/118 |
| 8,884,584 B2 * | 11/2014 | Emori | ................... | B60L 3/0046 320/116 |
| 8,901,889 B2 * | 12/2014 | Ishibashi | ............... | H02J 7/0063 320/118 |
| 8,912,756 B2 * | 12/2014 | Emori | ................... | B60L 3/0046 320/116 |
| 8,970,162 B2 * | 3/2015 | Kim | ..................... | H02J 7/0019 320/103 |
| 9,008,902 B2 * | 4/2015 | Kubo | ................. | B60L 11/1855 324/522 |

(56) References Cited

U.S. PATENT DOCUMENTS

| | | | |
|---|---|---|---|
| 9,018,905 B2* | 4/2015 | Lim | B60L 11/1861 320/116 |
| 9,035,611 B2* | 5/2015 | Kikuchi | B60L 3/0046 320/116 |
| 9,048,670 B2* | 6/2015 | Kim | H02J 7/0019 |
| 9,065,154 B2* | 6/2015 | Butzmann | H01M 10/425 |
| 9,077,184 B2* | 7/2015 | Fujita | H01M 10/44 |
| 9,136,714 B2* | 9/2015 | Tsai | H02J 7/0042 |
| 9,184,605 B2* | 11/2015 | Chang | B60L 11/1866 |
| 9,203,248 B2* | 12/2015 | Ohkawa | B60L 3/0046 |
| 9,333,874 B2* | 5/2016 | Kubo | B60L 11/1855 |
| 9,397,509 B2* | 7/2016 | Heidenreich | H02J 7/0019 |
| 9,478,995 B2* | 10/2016 | Hayakawa | H02J 7/0016 |
| 9,490,506 B2* | 11/2016 | Suzuki | H01M 2/34 |
| 9,653,921 B2* | 5/2017 | Yoo | H02J 7/022 |
| 9,673,640 B2* | 6/2017 | Kudo | H02J 7/0016 |
| 9,746,525 B2* | 8/2017 | Kudo | B60L 3/0046 |
| 9,853,497 B2* | 12/2017 | Heidenreich | H02J 9/061 |
| 2004/0113585 A1* | 6/2004 | Stanesti | H02J 7/0018 320/116 |
| 2004/0135544 A1* | 7/2004 | King | B60L 58/22 320/116 |
| 2004/0135545 A1* | 7/2004 | Fowler | B60L 58/22 320/118 |
| 2004/0135546 A1* | 7/2004 | Chertok | H01M 10/441 320/118 |
| 2005/0140335 A1* | 6/2005 | Lee | H02J 7/0018 320/118 |
| 2005/0242667 A1* | 11/2005 | Emori | B60L 3/0046 307/10.1 |
| 2006/0097696 A1* | 5/2006 | Studyvin | H02J 7/0018 320/116 |
| 2006/0214636 A1* | 9/2006 | Arai | H01M 10/441 320/116 |
| 2008/0072859 A1* | 3/2008 | Esaka | H02J 7/0019 123/179.3 |
| 2008/0090133 A1* | 4/2008 | Lim | H02J 7/0016 429/50 |
| 2008/0129247 A1* | 6/2008 | Lee | H01M 10/441 320/134 |
| 2008/0191663 A1* | 8/2008 | Fowler | B60L 11/185 320/118 |
| 2008/0252257 A1* | 10/2008 | Sufrin-Disler | B60L 3/0046 320/118 |
| 2008/0272736 A1* | 11/2008 | Tien | H02J 7/0019 320/126 |
| 2008/0303484 A1* | 12/2008 | Lee | H02J 7/0016 320/134 |
| 2009/0091332 A1* | 4/2009 | Emori | B60L 11/1855 324/537 |
| 2009/0146610 A1* | 6/2009 | Trigiani | H02J 7/0018 320/119 |
| 2009/0208821 A1* | 8/2009 | Kosugi | B60L 3/0046 429/61 |
| 2009/0267565 A1* | 10/2009 | Studyvin | H02J 7/0016 320/116 |
| 2009/0289599 A1* | 11/2009 | White | H02J 7/0068 320/120 |
| 2010/0007308 A1* | 1/2010 | Lee | H02J 7/0018 320/118 |
| 2010/0038962 A1* | 2/2010 | Komatsu | H02M 5/4585 307/10.1 |
| 2010/0106351 A1* | 4/2010 | Hanssen | B60K 6/48 701/22 |
| 2010/0207579 A1* | 8/2010 | Lee | H02J 7/0018 320/120 |
| 2010/0231166 A1* | 9/2010 | Lee | H02J 7/0016 320/118 |
| 2010/0259221 A1* | 10/2010 | Tabatowski-Bush | H02J 7/0021 320/134 |
| 2010/0295382 A1* | 11/2010 | Tae | G01R 31/3658 307/150 |
| 2011/0025270 A1* | 2/2011 | Nakanishi | B60L 11/1851 320/116 |
| 2011/0074354 A1* | 3/2011 | Yano | H01M 10/441 320/116 |
| 2011/0080138 A1* | 4/2011 | Nakanishi | H02J 7/0016 320/116 |
| 2011/0089898 A1* | 4/2011 | Lee | H02J 7/0016 320/116 |
| 2011/0187326 A1* | 8/2011 | Kawata | B60L 11/1868 320/116 |
| 2011/0199051 A1* | 8/2011 | Shimizu | H02J 7/0016 320/116 |
| 2012/0068715 A1* | 3/2012 | Martaeng | B60L 11/1857 324/434 |
| 2012/0104856 A1* | 5/2012 | Gottlieb | H02J 1/10 307/66 |
| 2012/0146588 A1* | 6/2012 | Ishibashi | H02J 7/0018 320/138 |
| 2012/0217806 A1* | 8/2012 | Heidenreich | H02J 7/0019 307/48 |
| 2012/0223677 A1* | 9/2012 | Yamauchi | H01M 10/425 320/116 |
| 2013/0015820 A1* | 1/2013 | Kim | H02J 7/0019 320/128 |
| 2013/0025893 A1* | 1/2013 | Ota | H02J 1/10 173/2 |
| 2013/0066572 A1* | 3/2013 | Terashima | H01M 10/482 702/63 |
| 2013/0119935 A1* | 5/2013 | Sufrin-Disler | B60L 3/0046 320/116 |
| 2013/0127419 A1* | 5/2013 | Peter | H02J 7/0018 320/119 |
| 2014/0015472 A1* | 1/2014 | Tsai | H02J 7/0042 320/103 |
| 2014/0028098 A1* | 1/2014 | Trigiani | H02J 7/0018 307/39 |
| 2014/0145681 A1* | 5/2014 | Vuorilehto | H02J 7/0016 320/134 |
| 2014/0152261 A1* | 6/2014 | Yamauchi | B60L 11/1866 320/118 |
| 2014/0229078 A1* | 8/2014 | Takeo | B60L 11/1851 701/50 |
| 2014/0266051 A1* | 9/2014 | Hayakawa | H02J 7/0016 320/118 |
| 2014/0377594 A1* | 12/2014 | Suzuki | H01M 2/34 429/7 |
| 2015/0188334 A1* | 7/2015 | Dao | H02J 7/0013 320/107 |
| 2016/0329741 A1* | 11/2016 | Heidenreich | H02J 7/0019 |
| 2017/0005371 A1* | 1/2017 | Chidester | H01M 10/425 |
| 2017/0271889 A1* | 9/2017 | Sugeno | H02J 7/0019 |
| 2018/0115189 A1* | 4/2018 | Heidenreich | H02J 9/061 |

FOREIGN PATENT DOCUMENTS

| | | | | |
|---|---|---|---|---|
| GB | | 834022 A | * 5/1960 | H02J 7/0019 |
| JP | | 2010104222 A | * 5/2010 | H01M 2/1022 |
| WO | WO-2009051413 A2 | | * 4/2009 | H02J 7/0018 |
| WO | WO 2009131336 A2 | | * 10/2009 | H02J 7/0016 |
| WO | WO-2009131336 A2 | | * 10/2009 | H02J 7/0016 |

* cited by examiner

CHARGE EQUALIZATION APPARATUS FOR A BATTERY STRING

CROSS-REFERENCE TO RELATED APPLICATION

This application is a division of U.S. patent application Ser. No. 14/113,257 filed on Oct. 22, 2013, which is a national stage application of PCT/KR2011/002926 filed on Apr. 22, 2011. The disclosure of each of the foregoing applications is incorporated herein by reference in its entirety.

TECHNICAL FIELD

The present invention relates to a charge equalization apparatus for charge equalization of a plurality of battery strings.

BACKGROUND ART

In the case of a battery operation system according to the related art, k batteries are divided into M module units and are connected to each other in series, in which each module is provided with switch blocks which are connected to a right of the battery. The switch block serves to select a specific cell to provide a current path to a capacitor of a next stage Further, a potential stored in the capacitor is read by an A/D converter and a value thereof is input to a microprocessor. The input battery sensing information is used as information to allow the microprocessor to operate the battery and if a specific cell is undercharged or overcharged, the microprocessor drives cell equalization apparatuses which are connected to each module in parallel to achieve the charge equalization of all the batteries.

However, when a plurality of batteries are operated for each module by being connected to each other in series in the battery operation system according to the related art, sensing circuits for sensing batteries for each module and the cell equalization apparatuses for each module are required.

However, the above-mentioned configuration requires the sensing circuits and the cell equalization apparatuses for each module, such that a circuit of the battery operation system may be complicated.

Further, when one module fails, the overall battery operation system is not used, which acts as a factor of reducing reliability of the battery operation system.

Therefore, a need exists for a method of reducing a volume and cost of the overall battery operation system by allowing the sensing circuit to control a part of the cell charge equalization apparatuses while configuring the number of sensing circuits for each module as small as possible.

Further, a need exists for a method for increasing reliability of the system by adopting the commercialized battery monitoring IC for the battery sensing and the cell balancing.

DISCLOSURE

Technical Problem

An object of the present invention is to provide a high-reliability, effective charge equalization apparatus by using the one charge equalization converter and a battery monitoring dedicated IC circuit without individual circuits increasing complexity being used for each cell or module to control a plurality of cells. Another object of the present invention is to provide a charge equalization apparatus for sufficiently controlling a quantity of charge input to cells while greatly reducing complexity, cost, and volume of a battery operation system.

Still another object of the present invention is to provide a charge equalization apparatus capable of overcoming a voltage stress of a control switch used by modularizing a plurality of batteries and stably using the batteries, in using a control switch under a high stack voltage of the batteries.

Technical Solution

In one general aspect, a charge equalization apparatus for a battery string includes: two or more detachable battery modules, each of the two or more detachable battery modules comprising: two or more battery cells; a switch block unit configured to switch the two or more battery cells; a module switch unit configured to select the switch block unit; and a battery monitoring unit configured to monitor the two or more battery cells and measure a cell potential of each of the two or more battery cells to transmit information on the cell potential; a control unit configured to receive the information from the battery monitoring unit, compare the information with a prestored reference value so as to determine whether charges of the two or more battery cells are equalized, and transmit a control signal to the battery monitoring unit; and a equalization converter configured to perform a charge equalization by charging or discharging the two or more battery cells, wherein the battery monitoring unit may be configured to control operations of the switch block unit and the module switch unit according to the control signal.

The module switch unit of the two or more detachable battery modules may be configured to share the equalization converter.

The control unit and the single equalization converter form a single master module; and each of the two or more detachable battery modules form a slave module and may be configured to be independently attachable to and detachable from the single master module.

When the slave module is attached to the single master module, the battery monitoring unit may be configured to be connected independently to the control unit.

The battery monitoring unit may be configured to be connected via communication with the control unit.

The battery monitoring unit and the switch block unit may be configured of a single integrated circuit.

The switch block unit or the module switch unit may be configured of at least any one of a metal oxide semiconductor field effect transistor (MOSFET), a bipolar junction transistor (BJT), and a relay.

The equalization converter may be configured of a chargeable/dischargeable DC/DC converter or an insulating transformer.

Advantageous Effects

According to the exemplary embodiments of the present invention, the charge equalization apparatus and the battery monitoring IC are used in one module and the specific function of the monitoring IC is used in the charge equalization apparatus, thereby reducing the complexity, cost, and volume of the overall battery operation system.

Further, according to the exemplary embodiments of the present invention, the charge equalization apparatus commonly uses one direct current (DC)-DC converter, thereby easily controlling the charge equalization current quantity and the charge equalization apparatus uses the high-reliability monitoring IC, thereby allowing the central processing unit (that is, control unit) to process the cell information in real time independent of the charge equalization circuit.

Further, according to the exemplary embodiments of the present invention, the charge equalization apparatus are modularized by being divided into the master unit and the slave unit, such that the charge equalization apparatus may be expanded and contracted independent of the number of batteries, the circuits are separated for each module, such that the circuits may be easily implemented, and when the circuits are damaged, only the damaged module is replaced, such that the effective countermeasure may be performed.

In addition, according to the exemplary embodiments of the present invention, the charge equalization apparatus uses the DC-DC converter and thus is driven for each module by dividing all the battery cells into a predetermined number, such that the voltage stress of the switches used in the switch blocks may be reduced and the driving algorithm of the charge equalization apparatus may be defined by the user or the program calculation and may vary by the communication between the central processing unit (that is, control unit) and the module.

Moreover, according to the exemplary embodiments of the present invention, all the battery cells are used by being grouped into the k battery modules, such that the charged charge of the battery cells may be sufficiently controlled by the low-voltage bidirectional control switch having only the k battery voltage as the withstand voltage, instead of the bidirectional control switch having the overall battery voltage as the withstand voltage.

DESCRIPTION OF DRAWINGS

The above and other objects, features and advantages of the present invention will become apparent from the following description of preferred embodiments given in conjunction with the accompanying drawings, in which.

BEST MODE

Hereinafter, exemplary embodiments of the present invention will be described in detail with reference to the accompanying drawings.

Figure 1:
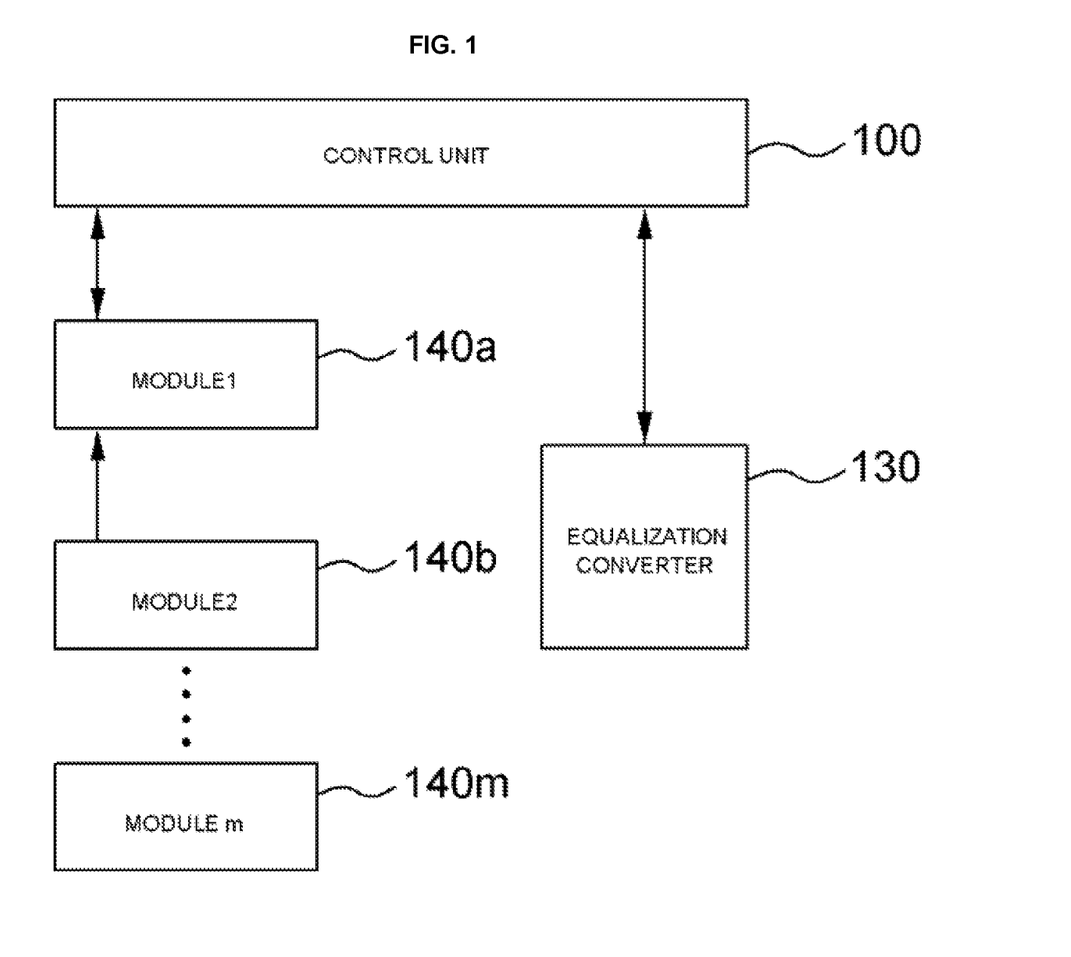
FIG. 1 is a conceptual diagram implementing a charge equalization apparatus according to an embodiment of the present invention.

FIG. 1 is a conceptual diagram implementing a charge equalization apparatus according to an embodiment of the present invention. The charge equalization apparatus according to the exemplary embodiment of the present invention includes detachable battery modules $140a$ to $140m$, a control unit $100$ which controls the detachable battery modules, an equalization converter $130$ which provides charge equalization of the battery modules $140a$ to $140m$ depending on a command of the control unit, and the like. These components will be described below.

Figure 2:
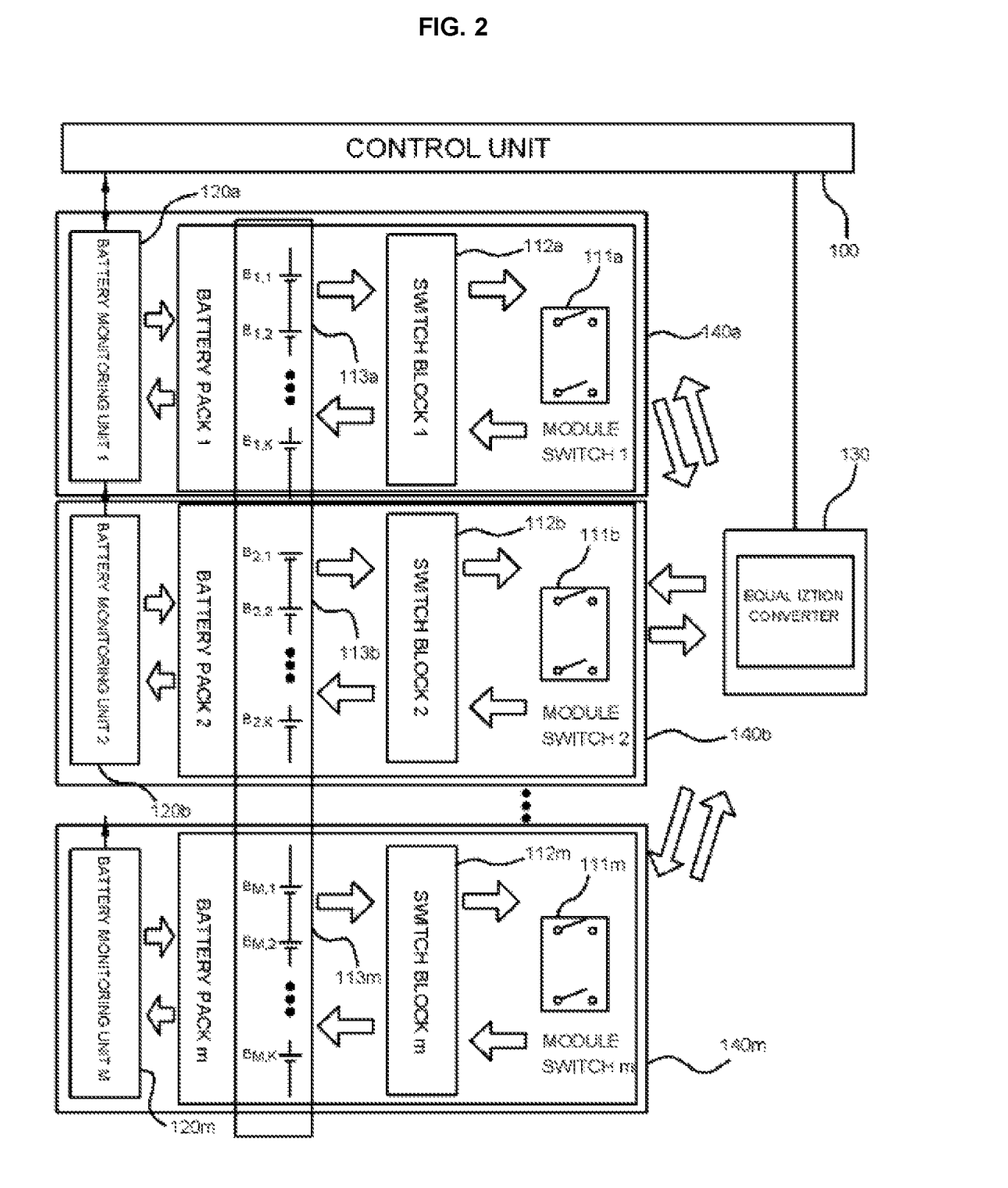
FIG. 2 is a circuit block diagram implementing the concept of FIG. 1.

The battery modules $140a$ to $140m$ are configured in a detachable type and include battery cells, a battery monitoring IC which monitors a state of the battery cells, and switches which switch the modules. This is illustrated in FIG. 2. This will be described below with reference to FIG. 2.

The control unit $100$ may be a microprocessor, a microcomputer, and the like and is programmed with an algorithm which performs a balancing (that is, charge equalization) operation of the battery cells according to the embodiment of the present invention. To this end, the control unit $100$ may include a memory, and as the memory, an internal memory of the control unit $100$ may also be used, or a separate memory may be used.

As the separate memory, non-volatile memories, such as an electrically erasable programmable read-only memory (EEPROM), a static RAM (SRAM), a ferro-electric RAM (FRAM), a phase-change RAM (PRAM), and a magnetic RAM (MRAM) may be used.

The equalization converter $130$ serves to perform the charge equalization of the battery modules $140a$ to $140m$ to implement at least one cell balancing (charge equalization) of the battery modules $140a$ to $140m$ depending on the command of the control unit $100$. Therefore, as the equalization converter $130$ a DC-DC converter of a chargeable and dischargeable type may be used.

FIG. 2 is a circuit block diagram implementing the concept of FIG. 1. Referring to FIG. 2, the battery module $140a$ among the detachable battery modules $140a$ to $140m$ is configured to include a battery pack $113a$ which is configured of battery cells $B_{1,1}$ to $B_{1,K}$, a monitoring unit $120a$ which monitors a state of the battery cells $B_{1,1}$ to $B_{1,K}$ in the battery pack $113a$, a switch block $112a$ which switches the battery cells $B_{1,1}$ to $B_{1,K}$ in the battery pack $113a$, a module switch unit $111a$ which switches to charge or discharge the corresponding battery cells by selecting the switch block $112a$, and the like. The detachable battery module $140a$ is arranged in plural ($140a$ to $140m$) within the equalization apparatus. These components will be described below.

The battery packs $113a$ to $113m$ include the plurality of battery cells $B_{1,1}$ to $B_{1,K}$ which are connected to each other in series, in which the plurality of battery cells are modularized in any number of batteries (normally, the battery cells are configured in 8, but the embodiment of the present invention is not limited thereto). Further, the case in which the battery cells $B_{1,1}$ to $B_{1,K}$ are configured in series within the battery pack $113a$ is illustrated, but the battery cells $B_{1,1}$ to $B_{1,K}$ may be configured in parallel. The battery cell may be a hybrid battery, such as a nickel metal battery and a lithium ion battery.

The battery monitoring units $120a$ and $120m$ may be configured using a battery dedicated IC which is commercially used. The battery monitoring units each transfer the state information of the battery cells (for example, $B_{1,1}$ to $B_{1,K}$) to the control unit $100$ and take part in the battery protection and the cell balancing (referred to as the charge equalization) control depending on the command of the control unit.

The switch block units $112a$ to $112m$ serve to connect a specific battery cell, which is undercharged during the charge equalization or overcharged, to the equalization converter $130$.

In addition to the cell switch block units 112a to 112m connected to the cells, the module switch units 111a to 111m are present in each module in each of the battery modules 140a to 140m and thus share the equalization converters 130 for each module. Further, these module switch units serve to insulate between the battery modules 140a to 140m to separate these battery modules as the individual module.

Figure 6:
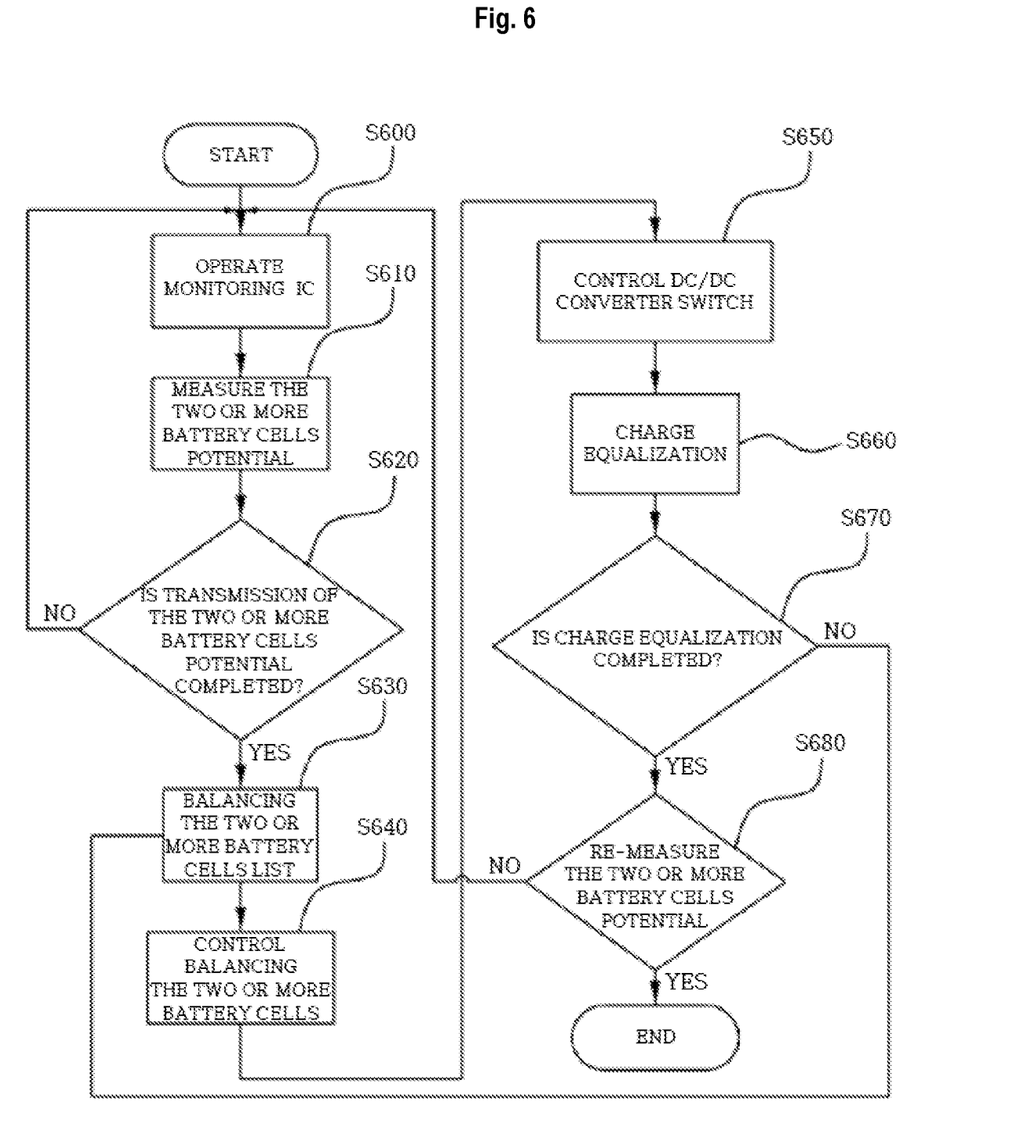
FIG. 6 is a flow chart illustrating an operation sequence of a charge equalization circuit according to the embodiment of the present invention.

Describing FIG. 2, voltage information and information such as temperature of the battery cells $B_{1,1}$ to $B_{M,K}$ are collected and controlled by the battery monitoring units 120a to 120m and the battery monitoring unit is partially responsible for the control of the equalization converter 130 through communication between the control unit 100 and the battery monitoring units 120a to 120m. The operation of the equalization converter 130 for the charge equalization is controlled depending on a defined algorithm through the battery cell sensing information of the control unit 100. The algorithm is illustrated in FIG. 6. This will be described below.

Figure 3:
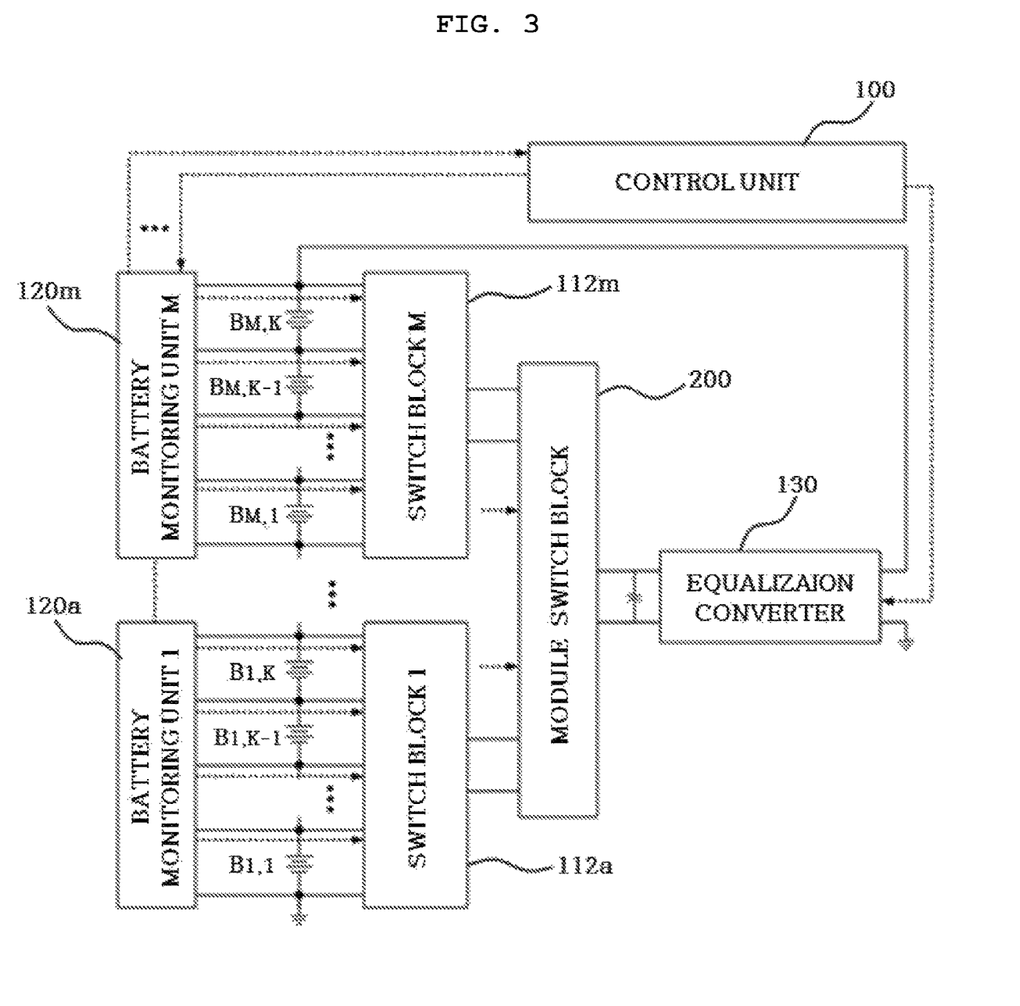
FIG. 3 is an overall configuration diagram of the charge equalization apparatus according to the embodiment of the present invention.

FIG. 3 is an overall configuration diagram of the charge equalization apparatus according to the embodiment of the present invention. That is, FIG. 3 illustrates an example of the charge equalization apparatus which uses one equalization converter 130, the battery monitoring units 120a to 120m, and the control switches 112a to 112m and a module switching block 200.

That is, the control unit 100 responsible for the system control based on the information of all the battery cells $B_{1,1}$ to $B_{M,K}$ is present and the one equalization converter 130 generating cell charge equalization energy is controlled by the control unit 100 and is connected to the module switching block 200. Further, according to the embodiment of the present invention, as the equalization converter 130, the chargeable/dischargeable bidirectional DC-DC converter may be used.

However, the embodiment of the present invention is not limited thereto. The module switch units 111a to 111m each present in each battery module are shared by the bidirectional cell selective switches 112a to 112m connected to each of the battery cells $B_{1,1}$ to $B_{M,K}$ and the cell switch blocks 112a to 112m selecting the cells are controlled by control signals of the battery monitoring units 120a to 120m. The battery monitoring units 120a to 120m which are present in each battery module are directly connected to each of the battery cells $B_{1,1}$ to $B_{M,K}$ to acquire the state information (for example, SOC, SOH, current, voltage, and the like) of the battery cells.

The battery monitoring units 120a to 120m collects the state information of each of the battery cells $B_{1,1}$ to $B_{M,K}$ and transfers the collected state information to the control unit 100, which is a central processing unit, depending on a data communication protocol. That is, as described above, the battery monitoring unit 120a collects the state information (for example, SOC, SOH, voltage, current, and the like) of each of the battery cells $B_{1,1}$ to $B_{1,K}$ and the battery monitoring unit 120m collects the state information of each of the battery cells $B_{M,1}$ to $B_{M,K}$.

The control unit 100 determines whether the charge of the specific battery cell is equalized by the defined algorithm to transmit the control signals to the battery monitoring units 120a to 120m of each of the battery modules 140a to 140m (FIG. 2). As such, the control unit 100 and the battery monitoring units 120a to 120m are connected to each other to transmit and receive the information to and from each other. That is, as illustrated in FIG. 3, the communication lines shown by a dotted line is connected to each other. Therefore, even though one of the battery modules 140a to 140m (FIG. 2) is removed due to an abnormal operation, the remaining battery modules may still communicate with the control unit 100.

Referring back to FIG. 3, the battery monitoring units 120a to 120m are directly connected to each of the battery cells to obtain the battery information in real time and receive the command of the control unit 100 to generate the specific control signal. The switch block units 112a to 112m and the module switching block 200 connected to the battery monitoring units 120a to 120m receive the control signals in the battery monitoring units 120a to 120m to turn on/off the switch block units 112a to 112m which select the corresponding battery cells $B_{M,1}$ to $B_{M,K}$, such that a cell charge equalization current path for the specific cell may be generated.

Further, the battery monitoring units 120a to 120m control turn on/off operations of the module switching units 111a to 111m (FIG. 2) of the corresponding battery modules 140a to 140m (FIG. 2). The control of the control unit 100 may be changed depending on the number of output pins of the battery monitoring units 120a to 120m and the control unit 100 may be configured to directly control the module switch units 111a to 111m (FIG. 2).

Figure 4:
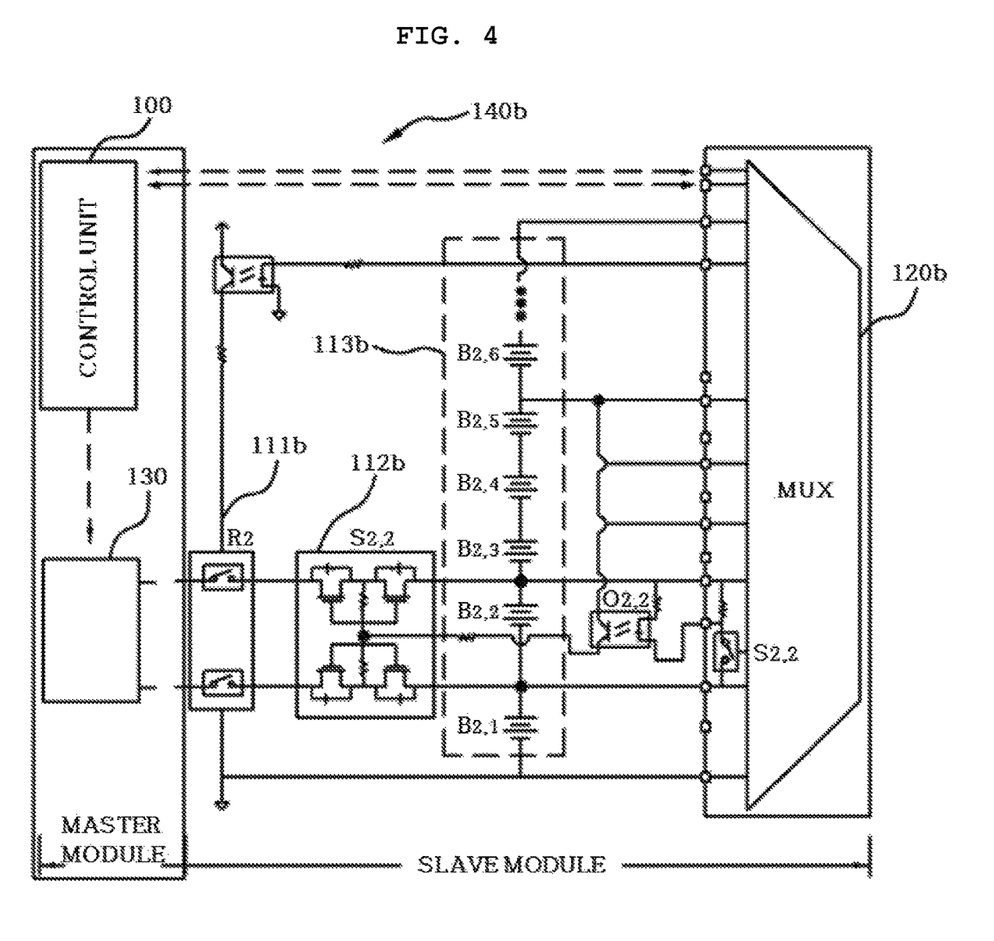
FIG. 4 is a diagram illustrating a circuit operation of the charge equalization apparatus for a second cell of a second module in FIG. 2.

FIG. 4 is a diagram illustrating a circuit operation of the charge equalization apparatus for a second cell of a second module in FIG. 2. For example, a battery stack monitor (Product Name: "LTC6802", Linear Technology Co.) may be applied to the battery monitoring units 120a to 120m and the application example is illustrated in FIG. 4. The "LTC6802" is directly connected to each of the battery cells to measure a potential of the battery cell and measure a temperature of the battery cell and includes a switch controlling the corresponding battery cell disposed therein.

Further, FIG. 4 illustrates only the case in which in order to understand the embodiment of the present invention, the "LTC6802" is applied, and therefore any electronic component having the above-mentioned function may also be applied.

Referring back to FIG. 4, the DC-DC converter 130 commonly used is operated by an overall voltage or an external voltage of battery cells $B_{2,1}$ to $B_{2,K}$ and is controlled bidirectionally or unidirectionally. Therefore, the DC-DC converter 130 serves to charge or discharge the specific battery cells $B_{2,1}$ to $B_{2,K}$. Further, the DC-DC converter 130 receives a pulse width modulation (PWM) signal of the control unit 100 or a PWM signal of a controller (a portion controlling the operation of the DC-DC converter 130) which is controlled by the control unit 100.

Low-voltage bidirectional control switches 111b and 112b which control the charging and discharging current of the battery cells $B_{2,1}$ to $B_{2,K}$ within the battery pack 113b are operated by receiving turn on and off signals of the battery monitoring unit 120b. In this case, the inputs of each of the bidirectional control switches 111b and 112b are connected to simple circuits $O_{2,2}$, $S_{2,2}$, and the like, which receive the turn on/off signals of the battery monitoring unit 120b to perform the turn on and off operations of the switch.

As illustrated in FIG. 4, the circuit uses the voltage of the battery cells $B_{2,1}$ to $B_{2,K}$ as a power supply apparatus and needs to perform the high-reliability turn on/off switch operations.

It is already described that the embodiment of the present invention may be configured of two units in structure. The control unit 100 which is a central processing unit and the DC-DC converter 130 are a single master module and the control switches 111b and 112b and the battery monitoring unit 120b is a slave module.

The master module controls the slave module based on the information on the overall battery situation and the system situation and generates charging/discharging energy for the cell charge equalization. The slave module serves to read the battery cell information which is connected to the module and control the switch for the charge equalization of the specific battery cell.

FIG. 4 illustrates a circuit which connects the low-voltage bidirectional control switches to each of the battery modules 140a to 140m (FIG. 2) and performs the individual charge equalization operation using the one common DC-DC converter 130.

Further, FIG. 4 illustrates an example in which the sensing circuit part which is intricately configured to sense the cell voltage information of each of the plurality of cells $B_{2,1}$ to $B_{2,K}$ is simply configured by using an integrated monitoring IC element. Further, FIG. 4 illustrates an example in which the battery stack monitor (Product Name "LTC6802", Linear Technology Co.) is applied, but the embodiment of the present invention is not limited thereto.

Next, the operation process of the charge equalization apparatus illustrated in FIG. 4 will be described. The battery cell to be charged (referring to FIG. 4, assumed to correspond to one of the battery cells $B_{2,1}$ to $B_{2,K}$ within the battery module 140b) is determined, and thus it is assumed that the bidirectional control switch 112b corresponding thereto is turned on and a relay switch 111b which is the module switch unit of the battery module 140b belonging to the battery cell to be charged is turned on. In this case, the bidirectional DC-DC converter 130 commonly used is operated by the control of the control unit 100.

In the case of the bidirectional DC-DC converter 130, the DC-DC converter may be operated to meet the charging or the discharging situation and in the case of the unidirectional DC-DC converter 130, the DC-DC converter 130 may be operated by a predefined direction. In this case, the operation of the used DC-DC converter may be changed depending on the used converter type. Further, in the case of a switched-mode power supply (SMPS) which receives the PWM control signal and in the case of performing an operation of a bipolar junction transistor (BJT) or other switches, the control method may be changed.

The amount of the charge equalization charging and discharging current may be simply and efficiently generated depending on the capacity of the battery cell by the one common DC-DC converter 130 illustrated in FIG. 4 and the use of the battery monitoring unit 120b may lead to the reduction in the cost and volume of the charge equalization apparatus.

The above-mentioned DC-DC converter 130 may be configured of a combination of the existing various types of DC-DC converters or linear regulators. In this case, each of the converters or regulators includes a switch unit and thus may be output bidirectionally or unidirectionally. The switch unit may be configured of a combination of switches electrically insulated from each other, such as an electrical switch and a mechanical switch. This is illustrated in FIG. 5.

Figure 5:
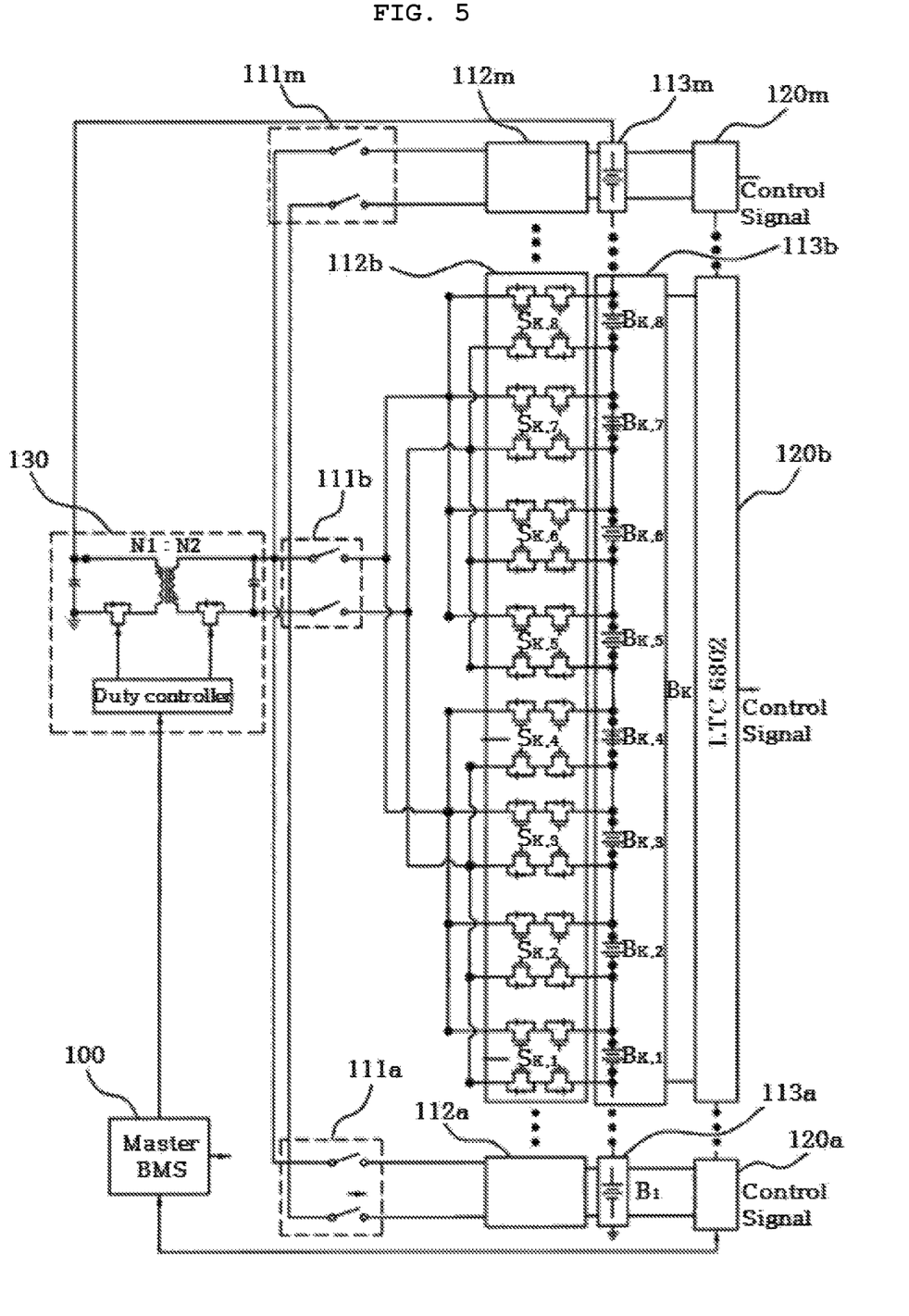
FIG. 5 is a circuit diagram illustrating a configuration example of an element of the charge equalization apparatus according to the embodiment of the present invention.

FIG. 5 is a circuit diagram illustrating a configuration example of an element of the charge equalization apparatus according to the embodiment of the present invention. Referring to FIG. 5, as the DC-DC converter, a flyback type bidirectional DC-DC converter 130 may be used and as the switch unit, a metal oxide semiconductor field effect transistor (MOSFET) may be used. FIG. 5 shows that the module switch units 111a to 111m are connected in parallel. Further, FIG. 5 illustrates an example in which the charge equalization apparatus illustrated in FIG. 1 is implemented using other circuit elements, and therefore it may be understood that the DC-DC converter and the switch may be configured of a combination of other apparatuses.

The charge equalization apparatus according to the embodiment of the present invention is performed when potentials of each of the serially connected batteries are different from each other under the situation in which the serially connected batteries are not connected to an electrical charging apparatus or electrical loads. However, when a current capacity of the charge equalization apparatus is large or a magnitude in the charged current or the discharged current is small, the charge equalization apparatus may be performed even though the serially connected batteries are connected to the electrical charging apparatus or the electrical loads.

The charge equalization apparatus according to the embodiment of the present invention starts to operate when the potentials of each of the battery cells are different from each other and the starting of the charge equalization apparatus is determined according to the algorithm previously programmed in the control unit 100 (FIG. 1) based on a battery cell voltage measurement value input to the control unit 100, a state of charge (SOC) value by the battery cell voltage, or a stage of health (SOH).

Next, a process of performing the charge equalization operation will be described with reference to the configuration and the operation of the charge equalization apparatus illustrated in FIGS. 1 to 5. FIG. 6 is a flow chart illustrating a sequence of the charge equalization operation according to the embodiment of the present invention.

Referring to the flow chart of FIG. 6, when the charge equalization algorithm stored in the control unit 100 is operated, the battery monitoring units 120a to 120m (FIG. 2) sense the potentials of the battery cells $B_{1,1}$ to $B_{M,K}$ disposed in each of the battery modules 140a to 140m in real time (steps S600 and S610).

The sensed cell potential values (that is, voltage values) of the battery cells $B_{1,1}$ to $B_{M,K}$ are transmitted to the control unit 100 from the battery monitoring units 120a to 120m through the communication lines between the battery monitoring units 120a to 120m and the control unit 100. Further, the transmission may be performed in real time or at each predetermined time period. Therefore, the control unit 100 determines whether the transmission is completed (step S620).

As the determination result, when the transmission from the battery monitoring units 120a to 120m to the control unit 100 is completed, the control unit 100 generates a list of the battery cells exceeding a reference value and the battery cells less than the reference value based on a cell balancing targeted voltage of all of the batteries (step S630).

Unlike this, as the determination result of the step S620, when the transmission of the potential values of the battery cells is not completed, the steps S600 to S620 are executed again.

When the battery cell to be charged or discharged by the cell list is defined, the control unit 100 first connects the corresponding battery modules 140a to 140m of at least one of the module switch units 110a to 110m (FIG. 2) to the equalization converter 130. Further, the battery monitoring units 120a to 120m connect the corresponding battery modules to the equalization converters. When the corresponding battery module (this may be in singular or plural) is connected to the equalization converter 130, the battery monitoring units 120a to 120m allow the switch block unit 112a to select the corresponding battery cells $B_{1,1}$ to $B_{M,K}$ (step S640).

Further, the control unit 100 performs the following operation to perform the charge equalization process.

Step a): When the potential of any battery cell configuring the serially connected battery is higher or lower than a preset value, the control command is transferred to the battery monitoring units 120a to 120m of the corresponding battery modules 140a to 140m.

Step b): The battery monitoring units 120a to 120m of the corresponding battery modules 140a to 140m are operated. The battery monitoring units 120a to 120m preferentially operate the bidirectional control switches 111a to 111m by the internal switch. Next, the control signal to operate the module switch units 112a to 112m associated with the battery modules in which the corresponding battery cells are included is transmitted.

Step c): The control unit 100 performs the charge equalization operation by operating the common equalization converter 130 (in particular, DC-DC converter) in the charging direction or the discharging direction.

Referring back to FIG. 6, when the corresponding battery cell is selected, the equalization converter 130 charges a charge in the corresponding battery cell or discharges a charge from the corresponding battery cell to perform the charge equalization (steps S650 and S660).

Further, the equalization converter 130 sequentially performs the charge equalization operation from the most preferential battery cell depending on the command of the control unit 100.

The method of executing the charge equalization may be divided into largely four, which is as follows.

① When it is determined that the specific battery cell is undercharged over other cells:

The potential of the corresponding undercharged battery cell is effectively increased by moving the total energy of the battery to an undercharged battery cell.

② When it is determined that only the specific cell is undercharged:

The potential of the corresponding undercharged battery cell is effectively increased by moving the energy of the external power supply to the undercharged battery cell.

③ When it is determined that the specific battery cell is overcharged over other cells:

The potential of the overcharged battery cell is effectively reduced by moving the overcharged battery energy to all the battery calls.

④ When it is determined that only the specific battery cell is overcharged:

The potential of the corresponding overcharged battery cell may be reduced by moving the overcharged battery energy to the external power supply.

The overall charge equalization effect is implemented by repeating the above ① to ④ processes.

Further, for the charge equalization, a predetermined operation time (hereinafter, referred to as the charge equalization time) is present and in defining the predetermined operation time, various methods may be present. These methods are as follows.

i) A method of defining the charge equalization time by mathematical modeling depending on the charging or discharging current quantity of the equalization converter 130 and an energy storage capacity of the battery cell. The charge equalization operation time is defined by the so obtained charge equalization time and the equalization converter may be turned on/off depending on the operation time.

ii) A method of using the value previously stored in the control unit 100. Therefore, when the specific battery cell reaches the preset cell voltage value by the equalization converter 130 based on a relationship table between the stage of charge (SOC) value and the voltage of the corresponding battery cell, the method is a method of turning off the equalization converter.

Herein, the value of the corresponding battery cell which is previously stored may be changed by the user. As an example, the value of the specific cell may be an average value of all the batteries, an SOC average of all the batteries, and a specific value which is increased or reduced to a preset fixed value in the average or SOC of all the batteries.

iii) A method of periodically performing the charge equalization operation in the specific battery cell for a predetermined time, not driving the apparatus for the predetermined charge equalization time and then comparing the cell voltage or the user's desired value through the SOC and SOH measurement with the reference value which is programmed or previously stored. The reference value may be any one of the user's designated voltage, the battery pack or average voltage, and the user's designated voltage and the state of health (SOH) increased and decreased in the battery pack or average voltage.

By the comparison and the continuous driving of the cell, the charge equalization is performed after the predetermined time. In this case, the reference value of the specific cell may be defined by the above-mentioned method.

Referring back to FIG. 6, the control unit 100 (FIG. 2) determines whether the charge equalization is completed by the process (step S670).

As the determination result, when the charge equalization for the corresponding battery cells $B_{1,1}$ to $B_{M,K}$ is completed, the battery monitoring units 120a to 120m re-measures the potentials of the battery cells to determine whether the potentials of the battery cells reach the reference value (step S680).

Unlike this, in the step S670, when the charge equalization for the corresponding battery cells $B_{1,1}$ to $B_{M,K}$ is not completed, the steps S630 to S670 are performed. In the step S680, when the re-measured potential of the battery cell reaches the reference value, the charge equalization process ends.

Although the exemplary embodiment of the present invention has been described above with reference to the accompanying drawings, it may be appreciated by those skilled in the art that the scope of the present invention is not limited to the above-mentioned exemplary embodiment, but may be variously modified.

The invention claimed is:

1. A charge equalization apparatus for a battery string, comprising:

two or more detachable battery modules, each of the two or more detachable battery modules comprising: two or more battery cells; a switch block unit configured to switch the two or more battery cells; a module switch unit configured to separate all electrical connections for each of the two or more detachable battery modules from each other and to select the switch block unit; and a battery monitoring unit configured to monitor the two or more battery cells and measure a cell potential of each of the two or more battery cells to transmit information on the cell potential;

a control unit configured to receive the information from the battery monitoring unit, compare the information with a prestored reference value to determine whether charges of the two or more battery cells are equalized, and transmit a control signal to the battery monitoring unit; and a single equalization converter configured to perform a charge equalization by charging or discharging the two or more battery cells, wherein the module switch units of the two or more detachable battery modules are connected in parallel and are configured to share the equalization converter, wherein the battery monitoring unit is a battery stack monitor directly connected to each of the two or more battery cells and is connected via communication with the control unit to receive the control signal from the control unit and controls operations of the switch block unit and the module switch unit according to the control signal, wherein the module switch unit is a relay, and wherein the control unit and the single equalization converter form a single master module; and each of the two or more detachable battery modules form a slave module and is configured to be independently attachable to and detachable from the single master module.

2. The charge equalization apparatus of claim 1, wherein when the slave module is attached to the single master module, the battery monitoring unit is configured to be connected independently to the control unit.

3. The charge equalization apparatus of claim 1, wherein the battery monitoring unit and the switch block unit are configured of a single integrated circuit.

4. The charge equalization apparatus of claim 1, wherein the switch block unit selected at least from a group consisting of a metal oxide semiconductor field effect transistor (MOSFET), a bipolar junction transistor (BJT), and a relay.

5. The charge equalization apparatus of claim 1, wherein the equalization converter is configured of a chargeable/dischargeable DC/DC converter or an insulating transformer.

* * * * *